(12) United States Patent
Pan et al.

(10) Patent No.: US 11,688,662 B2
(45) Date of Patent: Jun. 27, 2023

(54) THERMAL DISTRIBUTION NETWORK FOR SEMICONDUCTOR DEVICES AND ASSOCIATED SYSTEMS AND METHODS

(71) Applicant: Micron Technology, Inc., Boise, ID (US)

(72) Inventors: Ling Pan, Singapore (SG); Sook Har Leong, Singapore (SG); Kelvin Tan Aik Boo, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/460,126

(22) Filed: Aug. 27, 2021

(65) Prior Publication Data
US 2023/0061803 A1    Mar. 2, 2023

(51) Int. Cl.
| H01L 25/00 | (2006.01) |
| H01L 23/31 | (2006.01) |
| H01L 23/373 | (2006.01) |
| H01L 21/50 | (2006.01) |
| H01L 25/065 | (2023.01) |

(52) U.S. Cl.
CPC ............ *H01L 23/373* (2013.01); *H01L 21/50* (2013.01); *H01L 25/0657* (2013.01)

(58) Field of Classification Search
CPC .... H01L 25/0657; H01L 23/373; H01L 21/50
See application file for complete search history.

(56) References Cited

U.S. PATENT DOCUMENTS

| 11,088,108 B2* | 8/2021 | Yang | .................... H01L 23/562 |
| 11,282,811 B2* | 3/2022 | Boo | ................ H01L 23/49822 |
| 11,452,198 B2* | 9/2022 | Louco | ................ H05K 1/0203 |

* cited by examiner

*Primary Examiner* — Dale E Page
*Assistant Examiner* — Wilner Jean Baptiste
(74) *Attorney, Agent, or Firm* — Perkins Coie LLP

(57) ABSTRACT

Semiconductor devices and associated systems and methods are disclosed herein. In some embodiments the semiconductor devices include a package substrate, a controller die carried by the package substrate and a spacer carried by the package substrate spaced apart from the controller die. A thermally conductive material can be carried by an upper surface of the controller die and establish a thermal path extending from the upper surface of the controller die to the package substrate. The thermal path can reach the package substrate at a position horizontally between the controller die and the spacer. The semiconductor device can also include one or more dies at least partially carried by the spacer and at least partially above the controller die and the thermally conductive material. Each of the one or more dies is thermally insulated from the thermally conductive material, for example by a thermal adhesive layer between the two.

20 Claims, 7 Drawing Sheets

THERMAL DISTRIBUTION NETWORK FOR SEMICONDUCTOR DEVICES AND ASSOCIATED SYSTEMS AND METHODS

TECHNICAL FIELD

The present disclosure generally relates to semiconductor devices. In particular, the present technology generally relates to improved management of heat on stacked semiconductor devices.

BACKGROUND

Microelectronic devices, such as memory devices, microprocessors, and other electronics, typically include one or more semiconductor dies mounted to a substrate and encased in a protective covering. The semiconductor dies include functional features, such as memory cells, processor circuits, interconnecting circuitry, etc. Semiconductor die manufacturers are under continuous pressure to reduce the volume occupied by semiconductor devices while increasing the capacity and/or speed of the resulting semiconductor assemblies. To meet these demands, semiconductor die manufacturers often stack multiple semiconductor dies vertically on top of each other to increase the capacity and/or the performance of semiconductor devices within the limited area on a circuit board or other element to which the semiconductor devices and/or assemblies are mounted. The stacked dies are then electrically coupled to the circuit board and can send and receive signals individually or in conjunction. However, as the components of the semiconductor devices are stacked, the operating temperature of each component can impose limits on the overall performance.

Figure 1:
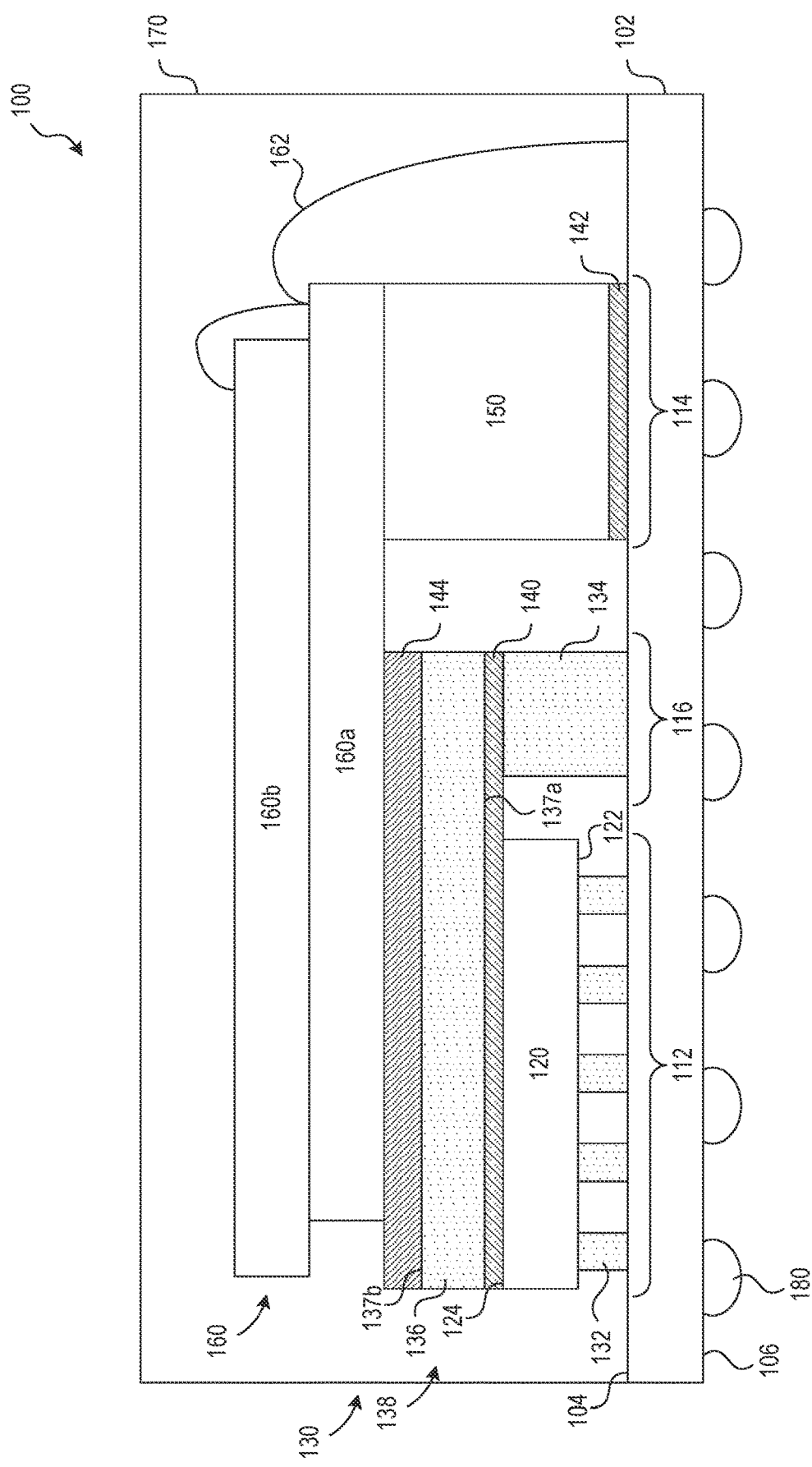
FIG. 1 is a partially cross-sectional view of a semiconductor device that includes a thermal distribution system in accordance with some embodiments of the present technology.

The drawings have not necessarily been drawn to scale. Similarly, some components and/or operations can be separated into different blocks or combined into a single block for the purpose of discussion of some of the implementations of the present technology. Moreover, while the technology is amenable to various modifications and alternative forms, specific implementations have been shown by way of example in the drawings and are described in detail below. The intention, however, is not to limit the technology to the particular implementations described.

DETAILED DESCRIPTION

Overview

Semiconductor devices that include internal thermal distribution networks, and associated systems and methods, are disclosed herein. In some embodiments the semiconductor devices include a package substrate, a first die (e.g., a controller die) carried by the package substrate, and a spacer carried by the package substrate spaced apart from the controller die. A thermal distribution network establishes one or more thermal pathways from the first die to the package substrate. One or more second dies (e.g., low power dies, such as memory dies, logic dies, and the like) at least partially carried by the spacer and positioned at least partially above the first die. Each of the one or more second dies are thermally insulated from the thermal distribution network and the first die. Accordingly, heat generated by the first die can be dispersed into the package substrate through the thermal distribution network. While being dispersed, the heat from the first die is kept separate from the one or more second dies. Similarly, heat generated by the one or more second dies can be dispersed into the package substrate through the spacer. While being dispersed, the heat from the second dies is kept separate from the thermal distribution network and the first die.

In some embodiments, the thermal distribution network can include a first thermally conductive component that is at least partially carried by an upper surface of the first die. The first thermally conductive component establishes a first thermal path extending from the upper surface of the controller die to the package substrate. The first thermal path can contact the package substrate at a position horizontally between the first die and the spacer. In some embodiments, the first thermally conductive component includes a first thermally conductive material (e.g., a first copper structure) carried by the upper surface of the controller die and a second thermally conductive material (e.g., a second copper structure) carried by the package substrate. The first thermally conductive material extends longitudinally away from the upper surface of the first die while the second thermally conductive material thermally couples the first thermally conductive material to the package substrate.

Additionally, or alternatively, the thermal distribution component can include a second thermally conductive component that is carried by the package substrate beneath the first die. The second thermally conductive component establishes a second thermal path extending from a lower surface of the first die to the package substrate. Additionally, or alternatively, the thermal distribution network can include a third thermally conductive component that is at least partially carried by the upper surface of the first die. The third thermally conductive component can establish a third thermal path extending from the upper surface of the first die to the package substrate on an opposite side of the controller die as the first thermal pathway. In some embodiments, the first and third thermally conductive components can be at least partially defined by a single thermally conductive material carried by the upper surface of the first die and extending longitudinally away from the first die in multiple directions.

In some embodiments, the semiconductor device includes an adhesive material on an upper surface of the first thermally conductive component. The adhesive material can both at least partially carry and/or directly contact the one or more second dies and insulate the first thermally conductive component from the one or more second dies.

For ease of reference, the semiconductor devices and their components are sometimes described herein with reference to top and bottom, upper and lower, upwards and downwards, and/or horizontal plane, x-y plane, vertical, or z-direction relative to the spatial orientation of the embodiments shown in the figures. It is to be understood, however, that the semiconductor devices and their components can be moved to, and used in, different spatial orientations without changing the structure and/or function of the disclosed embodiments of the present technology.

Further, although primarily discussed herein in the context of a thermal distribution network for use with a controller die, one of skill in the art will understand that the scope of the invention is not so limited. For example, the thermal distribution network can also be used to thermally isolate and disperse heat from any other component of a semiconductor device. Accordingly, the scope of the invention is not confined to any subset of embodiments, and is confined only by the limitations set out in the appended claims.

DESCRIPTION OF THE FIGURES

FIG. 1 is a partially cross-sectional view of a semiconductor device 100 that includes a thermal distribution network 130 in accordance with some embodiments of the present technology. As illustrated in FIG. 1, the semiconductor device 100 includes a package substrate 102 (e.g., a printed circuit board (PCB)) that has a first surface 104 (e.g., an upper surface or a die attach surface) and a second surface 106 (e.g., a lower surface or a package connection surface) opposite the first surface 104. A first die 120 (e.g., a controller die) and a spacer 150 are each carried by and thermally connected to the first surface 104. The first die is carried by a first region 112 of the package substrate 102 while the spacer 150 is carried by a second region 114 spaced apart from the first region 112. A stack of one or more second dies 160 (two shown, referred to individually as a "lowermost die 160a" and an "uppermost die 160b," also referred to collectively as a "die stack 160") is carried at least partially by the spacer 150 and is positioned at least partially above the first die 120. Each die in the die stack 160 is electrically coupled to the package substrate 102 by wire bonds 162, and thermally coupled to the package substrate 102 through the spacer 150. In various embodiments, each die in the die stack 160 can be a memory die, a logic die, or any other suitable kind of low-temperature die. Further, in some embodiments, the die stack 160 can include any combination of die types therein.

The thermal connection between the first die 120 and the first surface 104 is established by the thermal distribution network 130. In the illustrated embodiment, the thermal distribution network 130 includes a first thermally conductive material 132 (also referred to herein as a first "thermally conductive component" and/or a "first thermal structure") between the first region 112 of the package substrate 102 and a lower surface 122 of the first die 120. Accordingly, the first thermally conductive component 132 establishes a first thermal connection between the first die 120 and the first surface 104 in the first region 112. The thermal distribution network 130 also includes a second thermally conductive material 134 thermally coupled to the package substrate 102 at a third region 116 laterally between the first region 112 and the second region 114 (e.g., laterally between the first die 120 and the spacer 150), and a third thermally conductive material 136 thermally coupled to an upper surface 124 of the first die 120 and the second thermally conductive material 134 (referred to collectively as a "second thermally conductive component 138" and/or a "second thermal structure"). Accordingly, the second thermally conductive component 138 establishes a second thermal connection between the first die 120 and the third region 116 of the package substrate 102 laterally between the first die 120 and the spacer 150.

The first thermally conductive material 132, the second thermally conductive material 134, and the third thermally conductive material 136 can each be various metallic elements (e.g., gold, silver, copper, and/or any other suitable metal), alloys thereof, silicon, graphite, and/or any other suitable thermally conductive material. In some embodiments, each of the first-third thermally conductive materials 132, 134, 136 are the same material. In some embodiments, one or more of the first-third thermally conductive materials 132, 134, 136 can differ from the others.

In some embodiments, the spacer 150 can also include a material that is at least partially thermally conductive, thereby establishing a thermal pathway from the die stack 160 to the package substrate. In various embodiments, the spacer 150 can include various metallic elements (e.g., gold, silver, copper, and/or any other suitable metal), alloys thereof, silicon, graphite, and/or any other suitable thermally conductive material. In various embodiments, the spacer 150 can be the same as and/or a different material from each of the first-third thermally conductive materials 132, 134, 136. For example, in some embodiments, the spacer 150 includes a silicon substrate while each of the first-third thermally conductive materials 132, 134, 136 includes a copper material.

In the illustrated embodiment, the third thermally conductive material 136 includes a first thermal adhesive 140 on a lower surface 137a of the third thermally conductive material 136. The first thermal adhesive 140 can both thermally couple and physically attach the third thermally conductive material 136 to the upper surface 124 of the first die 120. In the illustrated embodiment, the first thermal adhesive 140 also facilitates the thermal coupling and physical attachment between the third thermally conductive material 136 and the second thermally conductive material 134. Similarly, in the illustrated embodiment, a second thermal adhesive 142 is between the spacer 150 and the package substrate 102. The second thermal adhesive 142 can both thermally couple and physically attach the spacer 150 to the package substrate 102.

In the illustrated embodiment, the third thermally conductive material 136 also includes an insulating adhesive film 144 ("insulating adhesive 140") on an upper surface 137b of the third thermally conductive material 136. As discussed in more detail below with respect to FIGS. 2 and 3A-3C, the insulating adhesive 144 creates a thermal barrier between the second thermally conductive component 138 and the die stack 160 such that heat from the die stack 160 does not enter the second thermally conductive component 138. The insulating adhesive 144 can also attach at least a portion of the lowermost die 160a to the upper surface 137b of the third thermally conductive material 136. Accordingly, the third thermally conductive material 136 can at least partially carry and/or secure the die stack 160.

As further illustrated in FIG. 1, the semiconductor device 100 can also include a molding compound 170 (e.g., an encapsulant) disposed over at least a portion of the first die 120, the thermal distribution system, the spacer 150, and the die stack 160. The molding compound can be an epoxy resin that is fully cured on the semiconductor device 100. Further, the semiconductor device 100 can also include one or more package connections 180 at the second surface 106 of the package substrate 102. One or more of the package connections 180 can be electrically coupled to the first die 120 and/or the die stack 160 through internal electronics (e.g., through substrate vias, redistribution layers, and the like (not shown)), thereby allowing the first die 120 and/or the die stack 160 to be electrically coupled to one or more components outside of the semiconductor device 100 (e.g., other semiconductor devices, other controller dies, other components of an electronic device, and the like). In various embodiments, the package connections 180 can include one or more solder structures (e.g., solder balls), one or more metal bond pads, and/or any other suitable conductive structure.

Figure 2:
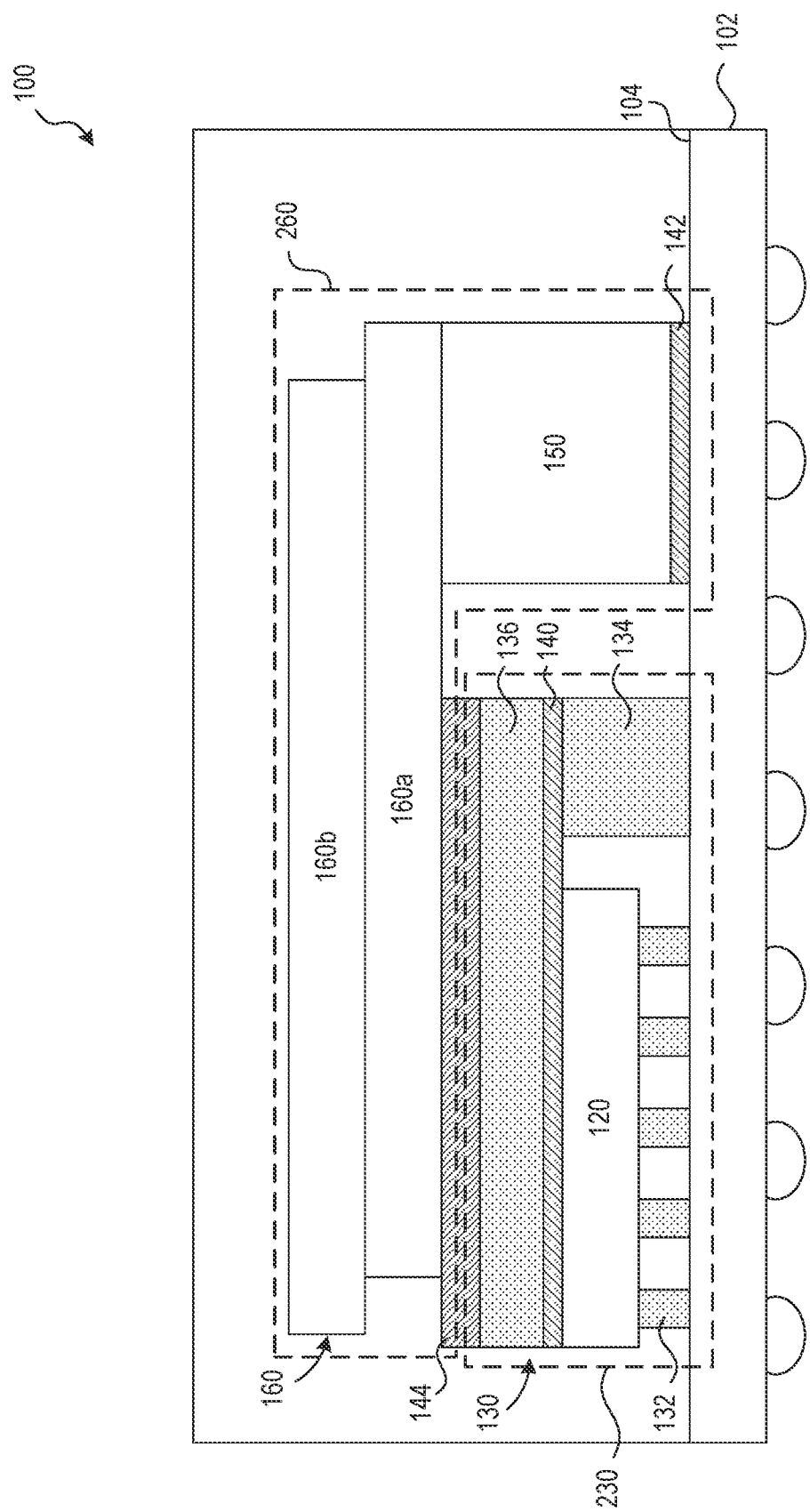
FIG. 2 is a partially cross-sectional view of the semiconductor device of FIG. 1 illustrating independent thermal systems in accordance with some embodiments of the present technology.

FIG. 2 is a partially cross-sectional view of the semiconductor device 100 of FIG. 1 in accordance with some embodiments of the present technology. As illustrated in FIG. 2, the semiconductor device 100 includes a first thermal subsystem 230 and a second thermal subsystem 260. The first thermal subsystem 230 includes the first die 120 and the thermal distribution network 130, while the second thermal subsystem 260 includes the spacer 150 and the die stack 160. The first and second thermal subsystems 230, 260 are thermally isolated from each other by the insulating adhesive 144. That is, the insulating adhesive 144 reduces (or completely prevents) heat flow from the first thermal subsystem 230 into the second thermal subsystem 260, as well as heat flow from the second thermal subsystem 260 into the first thermal subsystem 230. Accordingly, for example, the heat generated by the die stack 160 is impeded (or prevented) from flowing into the thermal distribution network 130 and/or the first die 120. Accordingly, the thermal distribution network 130 provides thermal pathways away from the first die 120 that are dedicated primarily to (or solely to) removing heat from the first die 120.

Figure 3A:
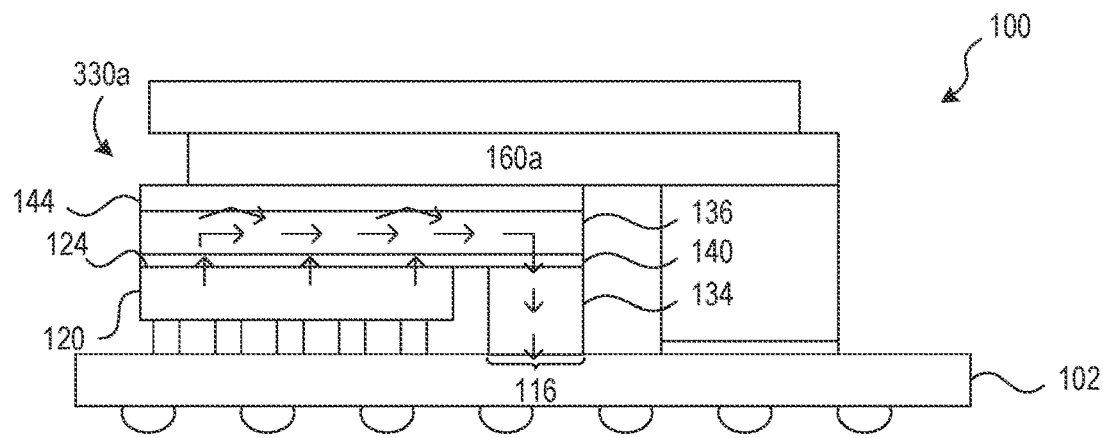
FIGS. 3A-3C are partially cross-sectional views of the semiconductor device of FIG. 1 illustrating multiple thermal pathways through the thermal distribution system in accordance with some embodiments of the present technology.
Figure 3B:
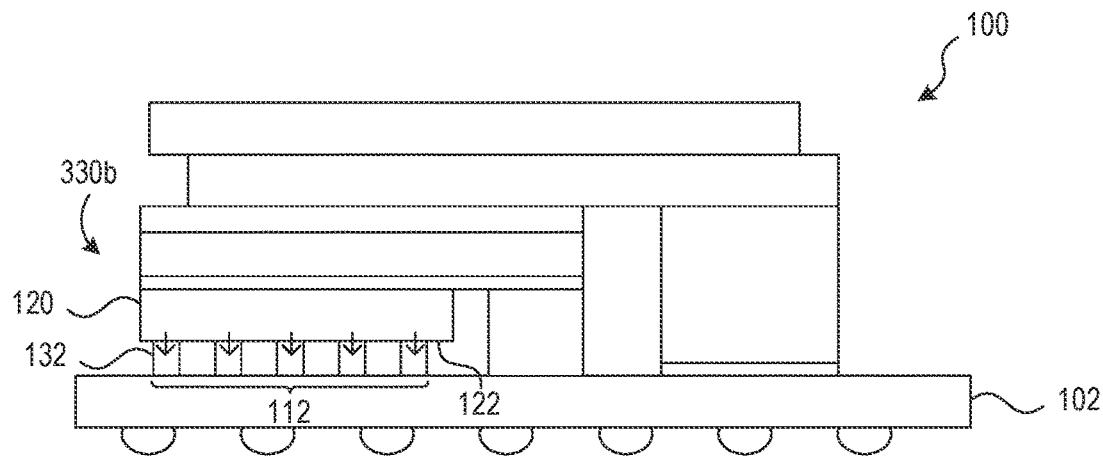
Figure 3C:
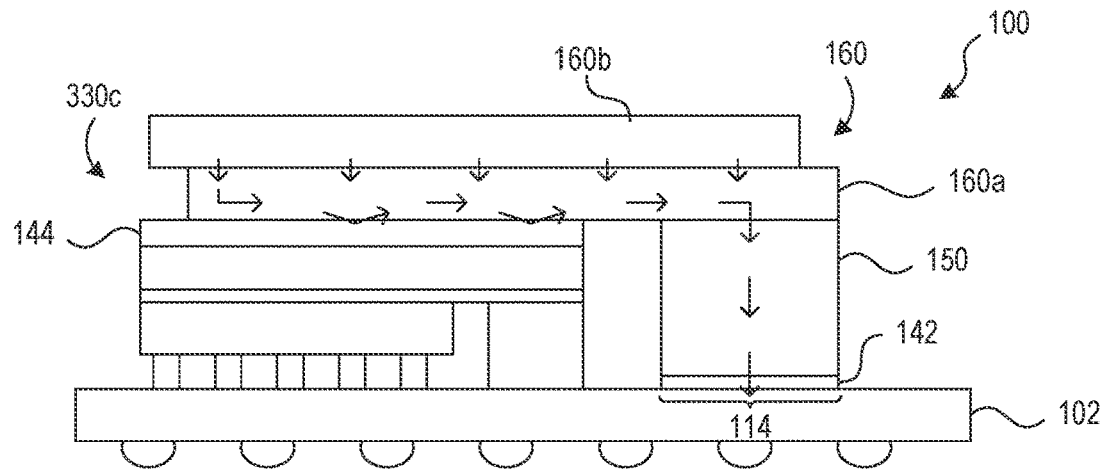

FIGS. 3A-3C are partially cross-sectional views of the semiconductor device 100 of FIG. 1 illustrating first-third thermal pathways 330a-330c through the semiconductor device 100 in accordance with some embodiments of the present technology. More specifically, FIGS. 3A and 3B illustrate the first and second thermal pathways 330a, 330b through the first thermal subsystem 230 (FIG. 2), while FIG. 3 illustrates the third thermal pathway through the second thermal subsystem 260.

As illustrated with respect to FIG. 3A, the first thermal pathway 330a (indicated by arrows) extends from the upper surface 124 of the first die 120 to the third region 116 of the package substrate 102 longitudinally (e.g., horizontally) between the first die 120 and the spacer 150. Along the first thermal pathway 330a, heat generated by the first die 120 flows out of the upper surface 124 of the first die 120 and through the first thermal adhesive 140 into the third thermally conductive material 136; longitudinally away from the upper surface 124 through the third thermally conductive material 136; out of the third thermally conductive material 136 through the first thermal adhesive 140 and into the second thermally conductive material 134; then out of the second thermally conductive material 134 and into the package substrate 102. That is, the first thermal pathway 330a includes a horizontal region extending away from the upper surface 124 of the first die 120 and a vertical region extending from a distal end (e.g., relative to the upper surface 124) of the horizontal region to the package substrate 102. As further illustrated in FIG. 3A, as the heat flows longitudinally away from the upper surface 124, through the third thermally conductive material 136 and along the horizontal region, the insulating adhesive 144 reflects at least some of the heat back into the third thermally conductive material 136. As a result, the heat is at least partially prevented from flowing into the lowermost die 160a of the die stack 160 by the insulating adhesive 144.

As illustrated in FIG. 3B, the second thermal pathway 330b (indicated by arrows) extends from the lower surface 122 of the first die 120 to the first region 112 of the package substrate 102 beneath the first die 120. Along the second thermal pathway 330b, heat generated by the first die 120 flows out of the lower surface 122 of the first die 120 and into the first thermally conductive material 132, downwards through the first thermally conductive material 132, then out of the first thermally conductive material 132 and into the package substrate 102.

As illustrated in FIG. 3C, the third thermal pathway 330c (indicated by arrows) extends from the uppermost die 160b in the die stack 160 to the second region 114 of the package substrate 102 beneath the spacer 150. Along the third thermal pathway 330c, heat generated by each die in the die stack 160 flows downwards through the lowermost die 160a, out from the lowermost die 160a and into the spacer 150, downwards through the spacer 150, then out of the spacer 150 through the second thermal adhesive 142 and into the package substrate 102. As further illustrated in FIG. 3C, as the heat flows downwards in the die stack 160, the insulating adhesive 144 at least partially reflects the heat back into the lowermost die 160a.

That is, referring to FIGS. 3A and 3C together, the insulating adhesive 144 at least partially prevents the heat from flowing out of the lowermost die 160a and into the first thermal pathway 330a. Accordingly, the insulating adhesive 144 thermally isolates the first and third thermal pathways 330a, 330c from each other, thereby maintaining the first thermal pathway 330a as dedicated to removing heat from the first die 120. The dedication of the first thermal pathway 330a can help ensure enough heat is removed from the first die 120 during operation of the semiconductor device 100 to avoid reductions in performance from overheating. Further, because the heat flowing out of the lowermost die 160a is restricted from entering the first thermal pathway 330a, the heat is also restricted from entering the first die 120, thereby also reducing the overall heat of the first die 120 during operation of the semiconductor device 100.

Figure 4:
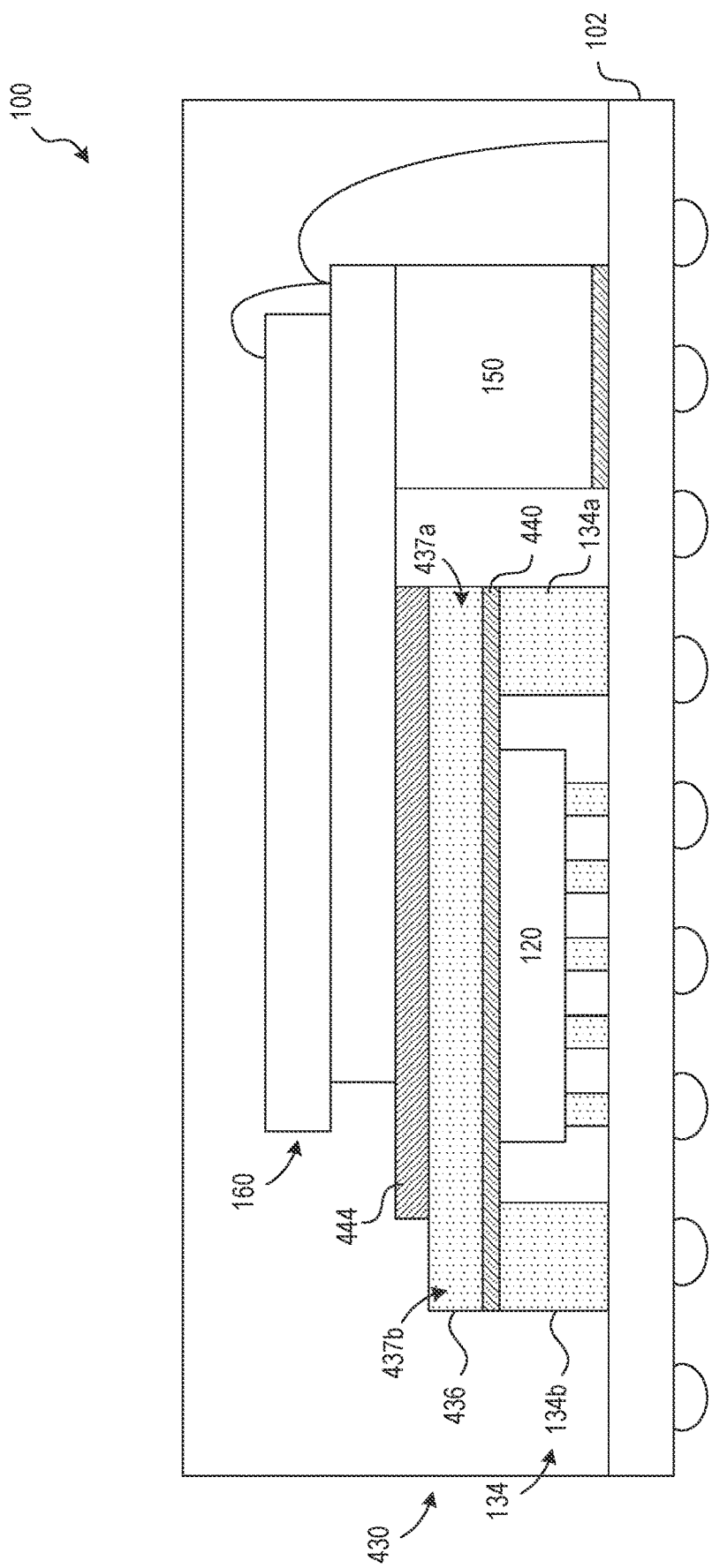
FIG. 4 is a partially cross-sectional view of a semiconductor device that includes a thermal distribution system in accordance with further embodiments of the present technology.

FIG. 4 is a partially cross-sectional view of a semiconductor device 100 that includes a thermal distribution network 430 in accordance with further embodiments of the present technology. As illustrated in FIG. 4, the semiconductor device is generally similar to the semiconductor device of FIG. 1 discussed above. For example, the semiconductor device 100 includes the package substrate 102, the first die 120 carried by and thermally coupled to the package substrate 102, the spacer 150 carried by and thermally coupled to the package substrate 102, and the die stack 160 at least partially carried by the spacer 150 and at least partially above the first die 120. However, in the illustrated embodiment, the thermal distribution network 430 includes thermally conductive materials configured in accordance with further embodiments of the present technology.

For example, as illustrated, the thermal distribution network 430 includes two portions of the second thermally conductive material 134 (referred to individually as first and second portions 134a, 134b). The first portion 134a is positioned on a first side of the first die 120 and between the first die 120 and the spacer 150, while the second portion 134b is positioned on a second side of the first die 120 opposite the first side. Further, the thermal distribution network 430 includes a third thermally conductive material 436 that has a larger longitudinal footprint than the third thermally conductive material 136 of the thermal distribution network 130 illustrated in FIG. 1.

In the illustrated embodiment, the third thermally conductive material 436 extends from a first end 437a above the first portion 134a to a second end 437b above the second portion 134b. Accordingly, the thermal distribution network 430 can establish multiple thermal pathways away from the upper surface 124 of the first die 120. For example, a first thermal pathway can extend from the upper surface 124 and into a central portion of the third thermally conductive material 436, through the first end 437a of the third thermally conductive material 436 and into the first portion 134a, then down to the package substrate 102 through the first portion 134a.

As further illustrated in FIG. 4, the semiconductor device 100 can include an insulating adhesive 444 that has a larger longitudinal footprint than the insulating adhesive 144 of FIG. 1. The larger longitudinal footprint can help ensure that heat does not travel around an outer edge 445 of the insulating adhesive 444 (e.g., either from the die stack 160 and into the thermal distribution network 430 or out of the thermal distribution network 430 and into the die stack 160). In the illustrated embodiment, the insulating adhesive 444 has a smaller longitudinal footprint than the third thermally conductive material 436. However, in various embodiments, the insulating adhesive 444 can have a generally equal longitudinal footprint or a larger longitudinal footprint than the third thermally conductive material 436.

Figure 5:
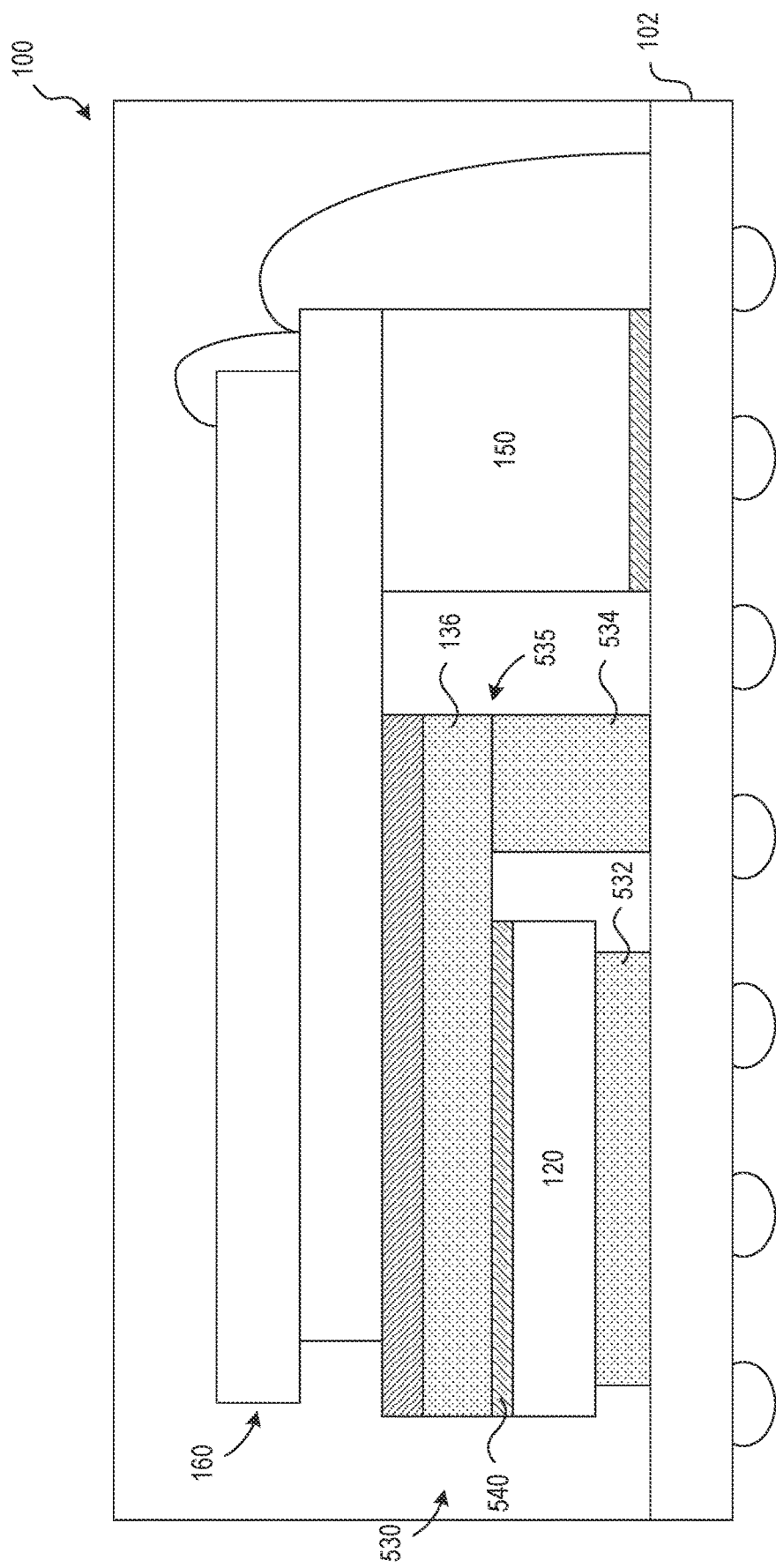
FIG. 5 is a partially cross-sectional view of a semiconductor device that includes a thermal distribution system in accordance with further embodiments of the present technology.

FIG. 5 is a partially cross-sectional view of a semiconductor device 100 that includes a thermal distribution system 530 in accordance with further embodiments of the present technology. As illustrated in FIG. 5, the semiconductor device is generally similar to the semiconductor device of FIG. 1 discussed above. For example, the semiconductor device 100 includes the package substrate 102, the first die 120 carried by and thermally coupled to the package substrate 102, the spacer 150 carried by and thermally coupled to the package substrate 102, and the die stack 160 at least partially carried by the spacer 150 and at least partially above the first die 120. However, in the illustrated embodiment, the thermal coupling between the components of the thermal distribution network 530 vary from the thermal coupling of the components of the thermal distribution network 130 in FIG. 1.

For example, as illustrated in FIG. 5, the thermal distribution network 530 can include a first thermally conductive material 532 that is a unitary piece of material. As a result, the first thermally conductive material 532 can contact a larger percentage of the lower surface 122 of the first die 120 than the first thermally conductive material 132 of FIG. 1. The larger contact area of the first thermally conductive material 532 can provide additional cross-sectional area for heat to flow out of the first die 120 through, but can limit room for air channels beneath the first die 120. In various other embodiments, the first thermally conductive material 532 can include any suitable number of pieces of material contacting any suitable percentage of the lower surface 122 of the first die 120. For example, the first thermally conductive material 532 can include two pieces of material, three pieces of material, ten pieces of material, and/or any other suitable number of pieces of material.

As further illustrated in FIG. 5, the thermal distribution network 530 can include a second thermally conductive material 534 with a larger height to directly contact the lower surface 137a of the third thermally conductive material 136 (e.g., rather than being thermally coupled through the first thermal adhesive 140 illustrated in FIG. 1). In some embodiments, rather than two materials in contact at a joint 535, the second and third thermally conductive materials 534, 136 (e.g., the second thermally conductive component) can be a single piece of material with an elbow at the location of the joint 535.

In the illustrated embodiment, the first thermal adhesive 540 has a smaller footprint than the first thermal adhesive 140 of FIG. 1 (e.g., matching the footprint of the first die 120). The smaller footprint is enabled by the direct contact between the second and third thermally conductive materials 534, 136, but can also be used in various other embodiments. For example, the semiconductor device 100 can include separate adhesive layers (e.g., to couple the second and third thermally conductive materials 134, 136 of FIG. 1), enabling each individual layer to have a relatively smaller footprint. In another example, the semiconductor device 100 can include relatively small adhesive layer when the second and third thermally conductive materials are a unitary piece of material.

Figure 6:
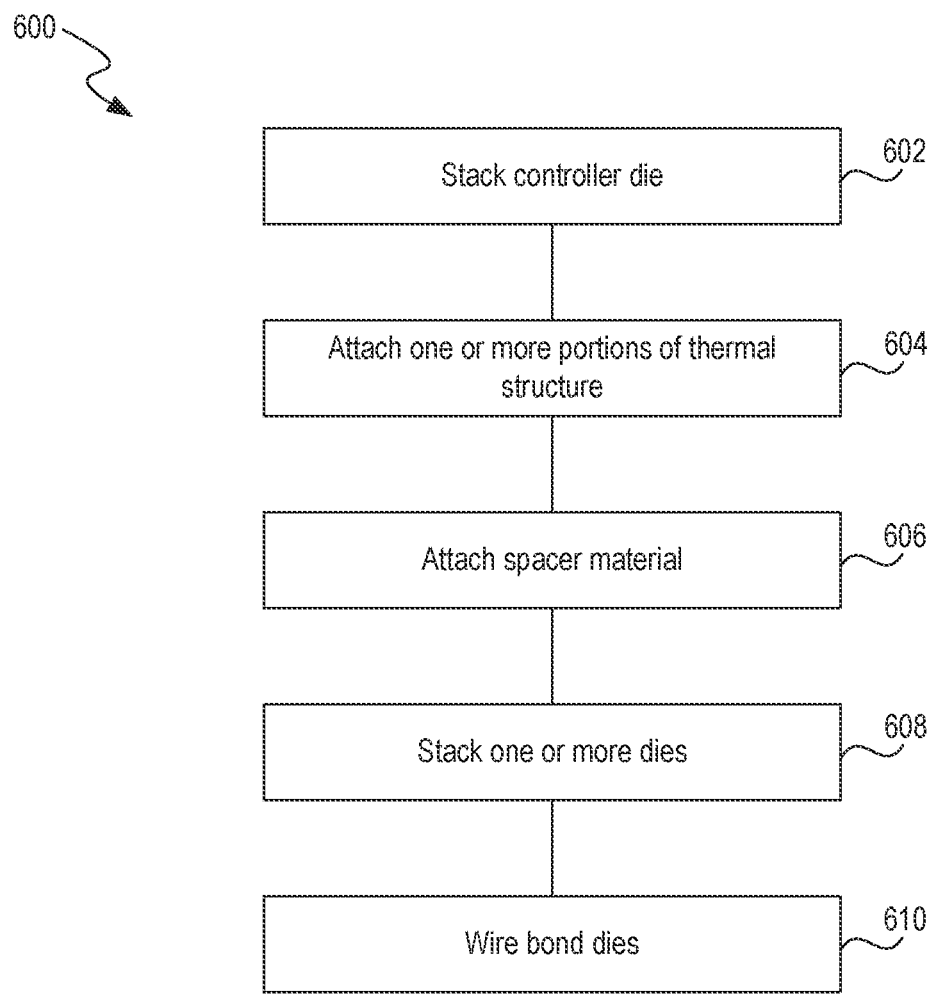
FIG. 6 is a flow diagram of a process for manufacturing a semiconductor device having a thermal distribution system in accordance with some embodiments of the present technology.

FIG. 6 is a flow diagram of a process 600 for manufacturing a semiconductor device having a thermal distribution system in accordance with some embodiments of the present technology. In the illustrated embodiment, the process 600 begins at block 602 with stacking a first die (e.g., a controller die) on a package substrate. The first die can stacked on top of a first thermally conductive material and/or spacer carried by the package substrate, or can be stacked directly on the package substrate itself.

At block 604, the process includes attaching one or more portions of a thermal distribution structure to the semiconductor device. For example, a first portion can be attached to the package substrate adjacent the first die, while a second portion can be attached to the upper surfaces of the first die and the first portion. In some embodiments, one or more portions are attached using a thermally conductive adhesive. In some embodiments, one or more portions are attached using a solder reflow process and/or a metal-metal bonding process. For example, the first portion can be attached adjacent the first die by a metal-metal bonding process while the second portion is attached by a thermally conductive adhesive.

At block 606, the process includes attaching one or more spacers to the package substrate. The spacer can be attached to the package substrate on an opposite side of the first portion of the thermal distribution structure discussed above, such that the first portion of the thermal distribution structure is horizontally between the first die and the spacer. In some embodiments, the spacer is attached using a second thermally conductive adhesive. In some such embodiments, the second thermally conductive adhesive is the same as the first thermally conductive adhesive.

In some embodiments, the process 600 returns to block 604 after block 606 to attach one or more additional portions of the thermal distribution structure to the semiconductor device. For example, in some embodiments, the process includes stacking the first die, attaching a first portion of the thermal distribution structure to the package substrate, attaching the spacer to the package substrate, then attaching a second portion of the thermal distribution structure to the first portion and the first die. In some embodiments, the process 600 executes block 606 before block 604 to attach the spacer before attaching any of the portions of the thermal distribution structure.

At block 608, the process includes stacking one or more second dies on top of the spacer at least partially over the thermal distribution structure. The one or more second dies can be memory dies, logic dies, and/or any other suitable type of die. In some embodiments, each of the one or more second dies generates less heat than the first die and/or is less sensitive to the effects of higher operating temperatures. In some embodiments, the one or more second dies are at least partially carried by the thermal distribution structure and the first die. In some embodiments, stacking the one or more second dies includes depositing an insulating adhesive on top of the thermal distribution structure to thermally isolate the one or more second dies from the thermal distribution structure and the first die.

At block 610, the process includes forming wire bond connections. In some embodiments, the wire bond connections formed at block 610 electrically intercouple each of the one or more second dies and/or intercouple any sub-group of the one or more second dies (e.g., intercoupling a first sub-stack, intercoupling a second sub-stack, etc.). Additionally, or alternatively, the wire bond connections can electrically couple any of the one or more second dies to the package substrate.

As discussed above, one or more of the blocks 602-610 can be performed in another order than illustrated, repeated, and/or omitted altogether. For example, as discussed above, the process 600 can execute block 604 after block 606 to attach the thermal distribution structure after the spacer. Further, the process 600 can repeat any of blocks as necessary to build up the semiconductor device (e.g., blocks 608 and 610 can be repeated to build up a larger die stack).

Figure 7:
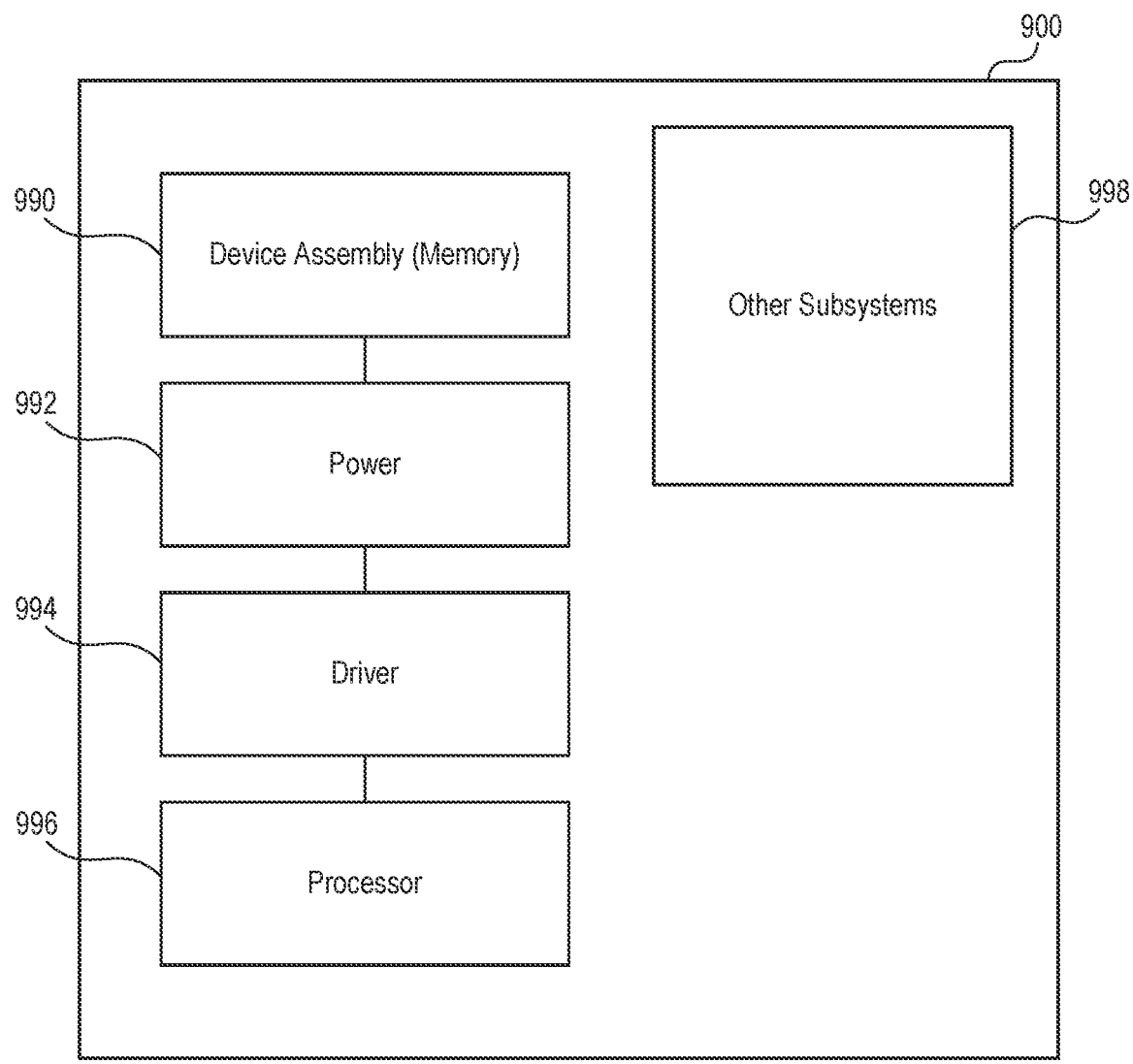
FIG. 7 is a schematic view of a system that includes a semiconductor die assembly configured in accordance with various embodiments of the present technology.

FIG. 7 is a schematic view of a system 900 that includes a semiconductor die assembly configured in accordance with embodiments of the present technology. Any one of the semiconductor devices having the features and/or resulting from the processes described above with reference to FIGS. 1-5 can be incorporated into any of a myriad of larger and/or more complex systems, a representative example of which is system 900 shown schematically in FIG. 7. The system 900 can include a memory 990 (e.g., SRAM, DRAM, flash, and/or other memory devices), a power supply 992, a drive 994, a processor 996, and/or other subsystems or components 998. Semiconductor devices like those described above with reference to FIGS. 1-5 (or resulting from the processes described above with respect to FIG. 6), can be included in any of the elements shown in FIG. 7. For example, the memory 990 can include a stacked semiconductor device with a thermal distribution system like that described above with respect to FIG. 1. The resulting system 900 can be configured to perform any of a wide variety of suitable computing, processing, storage, sensing, imaging, and/or other functions. Accordingly, representative examples of the system 900 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 900 include lights, cameras, vehicles, etc. With regard to these and other examples, the system 900 can be housed in a single unit or distributed over multiple interconnected units, e.g., through a communication network. The components of the system 900 can accordingly include local and/or remote memory storage devices and any of a wide variety of suitable computer-readable media.

CONCLUSION

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same features and/or additional types of other features are not precluded.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:
1. A semiconductor device, comprising:
   a package substrate;
   a controller die carried by the package substrate;
   a spacer carried by the package substrate spaced apart from the controller die;
   a thermally conductive component carried at least partially by an upper surface of the controller die, wherein the thermally conductive component establishes at least one thermal path extending from the upper surface of the controller die to the package substrate horizontally between the controller die and the spacer; and
   one or more dies at least partially carried by the spacer and at least partially above the controller die and the thermally conductive component, wherein each of the one or more dies is thermally insulated from the thermally conductive component.

2. The semiconductor device of claim 1, further comprising an adhesive film on an upper surface of the thermally conductive component, wherein the one or more dies are at least partially carried by the adhesive film, and wherein the adhesive film insulates the thermally conductive component from the one or more dies.

3. The semiconductor device of claim 1 wherein the thermally conductive component extends horizontally away from the upper surface of the controller die towards the spacer, and wherein the at least one thermal path extends from the upper surface of the controller die to a position on the package substrate.

4. The semiconductor device of claim 1 wherein the at least one thermal path is a first thermal path, and wherein the spacer is a silicon material establishing a second thermal path extending from the one or more dies to the package substrate.

5. The semiconductor device of claim 1 wherein the thermally conductive component includes:
a first thermally conductive material having a first end carried by the upper surface of the controller die and a second end opposite the first end, wherein the first thermally conductive material longitudinally away from the upper surface from the first end to the second end; and
a second thermally conductive material attached to the package substrate between the controller die and the spacer and carrying the second end of the first thermally conductive material.

6. The semiconductor device of claim 1 wherein the thermally conductive component includes:
a first thermally conductive material having a central portion carried by the upper surface of the controller die, a first end spaced longitudinally away from the upper surface in a first direction, and a second end spaced longitudinally away from the upper surface in a second direction opposite the first direction;
a second thermally conductive material attached to the package substrate and carrying the first end of the first thermal material; and
a third thermally conductive material attached to the package substrate and carrying the second end of the first thermal material,
wherein the at least one thermal path includes a first thermal path from the first thermally conductive material to the second thermally conductive material and a second thermal path from the first thermally conductive material to the third thermally conductive material.

7. The semiconductor device of claim 6, further comprising fourth thermally conductive material attached to the package substrate, wherein the controller die is stacked on top of the fourth thermally conductive material, and wherein the fourth thermally conductive material establishes at least one additional thermal path from a lower surface of the controller die to the package substrate.

8. The semiconductor device of claim 1 wherein the thermally conductive component includes one or more copper structures.

9. A semiconductor device, comprising:
a package substrate;
a first die carried by the package substrate;
a spacer carried by the package substrate spaced apart from the first die;
a stack of second dies at least partially carried by the spacer and at least partially carried by the first die; and
a plurality of thermal pathways, the plurality of thermal pathways including:
a first thermal pathway extending from an upper surface of the first die to the package substrate between the first die and the spacer; and
a second thermal pathway extending from a lowermost die in the stack of second dies to the package substrate, wherein the first and second thermal pathways are thermally insulated from each other.

10. The semiconductor device of claim 9 wherein the plurality of thermal pathways further includes third thermal pathway extending from a lower surface of the first die to the package substrate, wherein the first die is carried above the third thermal pathway.

11. The semiconductor device of claim 9 wherein the first thermal pathway includes a horizontal region extending away from the upper surface of the first die and a vertical region extending from the horizontal region to the package substrate, wherein the vertical region of the first thermal pathway is positioned between the first die and the second thermal pathway.

12. The semiconductor device of claim 9 wherein the stack of second dies is at least partially carried the first thermal pathway, and wherein the semiconductor device further comprises an adhesive film insulating the first thermal pathway from the stack of second dies and the second thermal pathway.

13. The semiconductor device of claim 9 the first thermal pathway is established by a first thermally conductive component, and wherein the second thermal pathway is established by a second thermally conductive component.

14. The semiconductor device of claim 13 wherein the first thermally conductive component includes one or more metallic elements, and wherein the second thermally conductive component includes a silicon substrate.

15. The semiconductor device of claim 9 wherein the plurality of thermal pathways further includes third thermal pathway extending from the upper surface of the first die to the package substrate in an opposite direction from the first thermal pathway.

16. The semiconductor device of claim 9 wherein the first die is a controller die.

17. A semiconductor device, comprising:
a package substrate;
a first die carried by a first region of the package substrate;
a spacer carried by a second region of the package substrate;
a thermally conductive component thermally coupled to an upper surface of the first die, wherein the thermally conductive component establishes a thermal path extending from the upper surface of the controller die to a third region of the package substrate horizontally between the first region and the second region;
one or more second dies at least partially carried by the spacer above the first die and the thermally conductive component; and
an adhesive film insulating the first thermal pathway from the stack of second dies and the second thermal pathway, wherein the adhesive film carries at least a portion of the one or more second dies.

18. The semiconductor device of claim 17 wherein the thermal pathway is a first thermal pathway, and wherein the spacer comprises a thermally conductive material establishing a second thermal pathway from a lowermost surface of the one or more second dies to the second region of the package substrate.

19. The semiconductor device of claim 17 wherein the thermally conductive component comprises a horizontal region extending away from the upper surface of the first die and a vertical region extending from the horizontal region to the second region of the package substrate, and wherein the vertical region is spaced apart from the spacer.

20. The semiconductor device of claim 17 wherein the thermal pathway is a first thermal pathway, wherein the thermally conductive component is a first thermally conductive component, and wherein the semiconductor device further comprises a second thermally conductive component coupled between a lower surface of the first die and the first region of the package substrate to establish a second thermal pathway.

\* \* \* \* \*